United States Patent
Berberich

(10) Patent No.: US 8,563,388 B2
(45) Date of Patent: Oct. 22, 2013

(54) METHOD FOR PRODUCING A PLURALITY OF INTEGRATED SEMICONDUCTOR COMPONENTS

(75) Inventor: Sven Berberich, Spardorf (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 244 days.

(21) Appl. No.: 12/727,759

(22) Filed: Mar. 19, 2010

(65) Prior Publication Data

US 2010/0330766 A1    Dec. 30, 2010

(30) Foreign Application Priority Data

Mar. 26, 2009   (DE) .................. 10 2009 001 919

(51) Int. Cl.
   *H01L 21/20*   (2006.01)
(52) U.S. Cl.
   USPC .................................. 438/381; 257/E21.351
(58) Field of Classification Search
   USPC ............ 438/381, 386; 257/E27.024, E27.033
   See application file for complete search history.

(56) References Cited

U.S. PATENT DOCUMENTS

| 7,067,869 B2 | 6/2006 | Cheng et al. |
| 7,738,226 B2 | 6/2010 | Berberich et al. |
| 2006/0286751 A1 | 12/2006 | Urakami et al. |
| 2007/0274014 A1* | 11/2007 | Berberich et al. ............ 361/91.7 |
| 2008/0044979 A1* | 2/2008 | Wells et al. .................. 438/424 |

FOREIGN PATENT DOCUMENTS

| DE | 10 2006 017 487 | 10/2007 |
| DE | 2006 017 487 | 10/2007 |

* cited by examiner

*Primary Examiner* — Brook Kebede
(74) *Attorney, Agent, or Firm* — The Law Offices of Roger S. Thompson

(57) ABSTRACT

A method for producing a plurality of integrated semiconductor components on a carrier, in which an active basic structure is introduced into the carrier in a continuous fashion at least across a portion of the boundaries of the semiconductor components to be created. The regions of the semiconductor components on the carrier are defined, and a covering layer is applied to the carrier in the region of each semiconductor component with the aid of a mask. The carrier is severed to form the individual semiconductor components at the boundaries thereof.

13 Claims, 3 Drawing Sheets

METHOD FOR PRODUCING A PLURALITY OF INTEGRATED SEMICONDUCTOR COMPONENTS

BACKGROUND OF THE INVENTION

1. Field of the Invention

The invention relates to a method for producing a plurality of integrated semiconductor components.

2. Description of the Related Art

Integrated semiconductor components are generally not produced individually, but rather are manufactured as an array on a carrier, e.g. on a silicon wafer. Know methods for producing integrated semiconductor components require many steps to produce components suitable for a particular application.

One such application is in the field of power electronics circuits, which require so-called snubber networks, or "snubbers". Snubbers dissipate parasitic energies in the relevant circuit or withdraw them from the circuit and feed them back later. Snubbers, generally consist of simple interconnections of resistances, capacitances and inductances. In a snubber component of this type, e.g., an RC element, the parasitic energy is dissipated, e.g., in the form of heat.

German Published Patent Application DE 10 2006 017 487 A1 discloses producing snubbers in an integrated design as an integrated semiconductor component. In accordance with the publication "Berberich, S. E.; Bauer, A. J.; Ryssel, H., High Voltage 3D-Capacitor, 12th European Conference on Power Electronics and Applications 2007 Proceedings EPE '07, 2-5 Sep. 2007, Aalborg, Denmark", it is known to fabricate integrated snubber components as 3D snubbers in a production process which constitutes a derivative of a standardized CMOS silicon technology. The electrical properties of the components are controlled, inter alia, by the intensity of the doping of the semiconductor materials and the area or size of the components.

In other words, photolithography steps are used for scaling the component base area or defining the chip area and for patterning the metallization.

The technology described results in great process engineering complexity. Furthermore, the complexity for scaling the components, i.e., with regard to their chip size, capacitance value and resistance value of the snubber components, is high. For changing the resistance, in this case, e.g., the area of the respective chip or the doping of the wafer is changed. For changing the capacitance of a component, the component area is altered, e.g. an area of approximately 15 $\mu m^2$ is required for producing a 15 nF capacitor having a dielectric strength of greater than 200 V, and approximately 20 $\mu m^2$ for a 20 nF capacitor.

SUMMARY OF THE INVENTION

It is an object of the invention to specify a method in which 3D snubber components can be scaled simply during production.

The invention is based on the recognition that, in the known standardized CMOS process, the component size or the area of the component has to be taken into account in each individual process step. By way of example, when changing the component area of an integrated capacitor to alter the capacitance value thereof, component size and area must be taken into account in all the mask steps of the entire process, as is the recognition that integrated snubbers consist of an active basic structure which is covered by a patterned covering layer, e.g. the upper metallization. The basic structure does not contain the covering layer. The basic structure per se is identical for components of different dimensions. The basic structure includes, for example, holes which are introduced into the wafer and lined with a dielectric to form a capacitor by means of the covering layer.

The invention is therefore based on the concept of manufacturing the components on the carrier so that the active basic structure is initially produced without regard to the actual boundaries of the components that will be formed. The initial steps are performed in a continuous fashion, without any gaps, without boundaries or reserved cutting regions, over the entire carrier. The basic structure is thus patterned according to the layout of individual chips in the region of the components that will subsequently be manufactured, and is therefore not limited to the desired component dimensions. Thus, subsequent component boundaries or cutting regions at which the components will subsequently be singulated are initially disregarded.

Ultimately individual components are not delimited to a specific region of the carrier until formation of the covering layer. Therefore, it is not until in a further step that the actual delimitation of the components arises by means of the targeted application of the metallizations in, and only in, the regions which are intended subsequently to form the respective individual component. The metallization, that is to say the top electrode or sawing side of the snubber component, is in this case patterned by means of a mask method, e.g., a so-called shadow casting mask.

The inventive method yields a plurality of integrated semiconductor components on a carrier and has the following steps: the active basic structure is introduced on the carrier as explained above, in a continuous fashion at least across a portion of the boundaries of components to be created. It is later that the regions of the semiconductor components on the carrier, such as the position, size and form of each semiconductor component or the boundaries thereof on the carrier are defined.

In each region which is intended subsequently to constitute an individual semiconductor component, a covering layer is then applied to the carrier or to the active basic structure with the aid of a mask or a mask method. Finally, the carrier is cut to form the semiconductor components at the boundaries.

The method affords the significant advantage that ultimately the component size, shape or position on the carrier is defined merely on the basis of the covering layer or the mask method, and the individual integrated semiconductor components to be produced can thus be defined in a particularly simple manner on the basis of this one step. On the basis of the structure of the mask in the mask method, the component size and thus, e.g., capacitance value, resistance value or chip area can consequently be scaled freely, that is to say particularly simply and cost-effectively, according to the inventive method. This considerably reduces the expenditure with regard to development, process engineering and costs for producing semiconductor components of this type.

In one preferred embodiment of the method, identical structure elements arranged alongside one another are introduced as a single basic structure into the carrier. Structure elements of this type are generally orders of magnitude smaller than the overall area of the integrated semiconductor component. In other words, each integrated semiconductor component consists of a very large number of identical structure elements. Thus, the dimensioning of the component is effected by the number of structure elements which the component subsequently has, i.e., by the carrier area covered by the individual semiconductor component.

Particularly for a basic structure of this type, it is advantageous that the structure elements can be introduced over the entire carrier without taking account of the component boundaries, which also significantly simplifies this process step.

In one preferred configuration of the abovementioned method, holes or trench structures are introduced as structure elements into the carrier. Snubber components having hole structures of this type are known, e.g., from German Published Patent Application DE 10 2006 017 487 A1 already cited. These are particularly well suited to the production of integrated capacitors.

In accordance with the method, the basic structure extends at least across a portion of what will be the boundaries of the components, that is, also over regions of the carrier which subsequently have to be severed during the separation of the components. In one embodiment of the method, the basic structure has an auxiliary layer, e.g., a specific layer, which poses problems, e.g., during the subsequent separation of the components. These are parts of the basic structure which would cause problems during the separation of the carrier, would spread during sawing or would product undesirable short circuits between individual layers. In this embodiment of the method, at the boundaries of the components, the corresponding portion of the auxiliary layer is subsequently removed again before the carrier is cut.

In one embodiment of the inventive method, the discussed portion of the basic structure is a topmost auxiliary layer, which is subsequently covered by the covering layer.

In a further embodiment of the inventive method, polysilicon is used as the auxiliary layer. Moreover, TMAH (tetramethylammonium hydroxide solution) can be used for removing the auxiliary layer. TMAH can, e.g., remove a highly doped polysilicon layer deposited as the auxiliary layer in a particularly simple manner. In this case, polysilicon is likewise deposited globally, that is to say without taking account of the components or their boundaries, on the carrier. In this case, TMAH works selectively with respect to the metal of the covering layer in the exposed regions, i.e., on the regions not covered by metal. The removal of the auxiliary layer then no longer requires a separate step, since the metallization already applied acts as a mask for TMAH.

In a further preferred embodiment of the method, the covering layer is produced with the aid of a shadow casting mask. The use of a shadow casting mask in a process step can be realized in a particularly cost-effective and simple manner.

In a further embodiment of the method, metal is applied as a covering layer.

In another embodiment of the method, a silicon wafer is used as the carrier.

In a further embodiment of the method, a semiconductor-based snubber component is produced as a semiconductor component.

In one embodiment of this method, a 3D snubber is produced as a semiconductor component.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

For a further description of the invention, reference is made to the exemplary embodiments in the drawings, in which, in each case in a schematic basic diagram.

DETAILED DESCRIPTION OF THE PRESENTLY PREFERRED EMBODIMENTS

Figure 1:
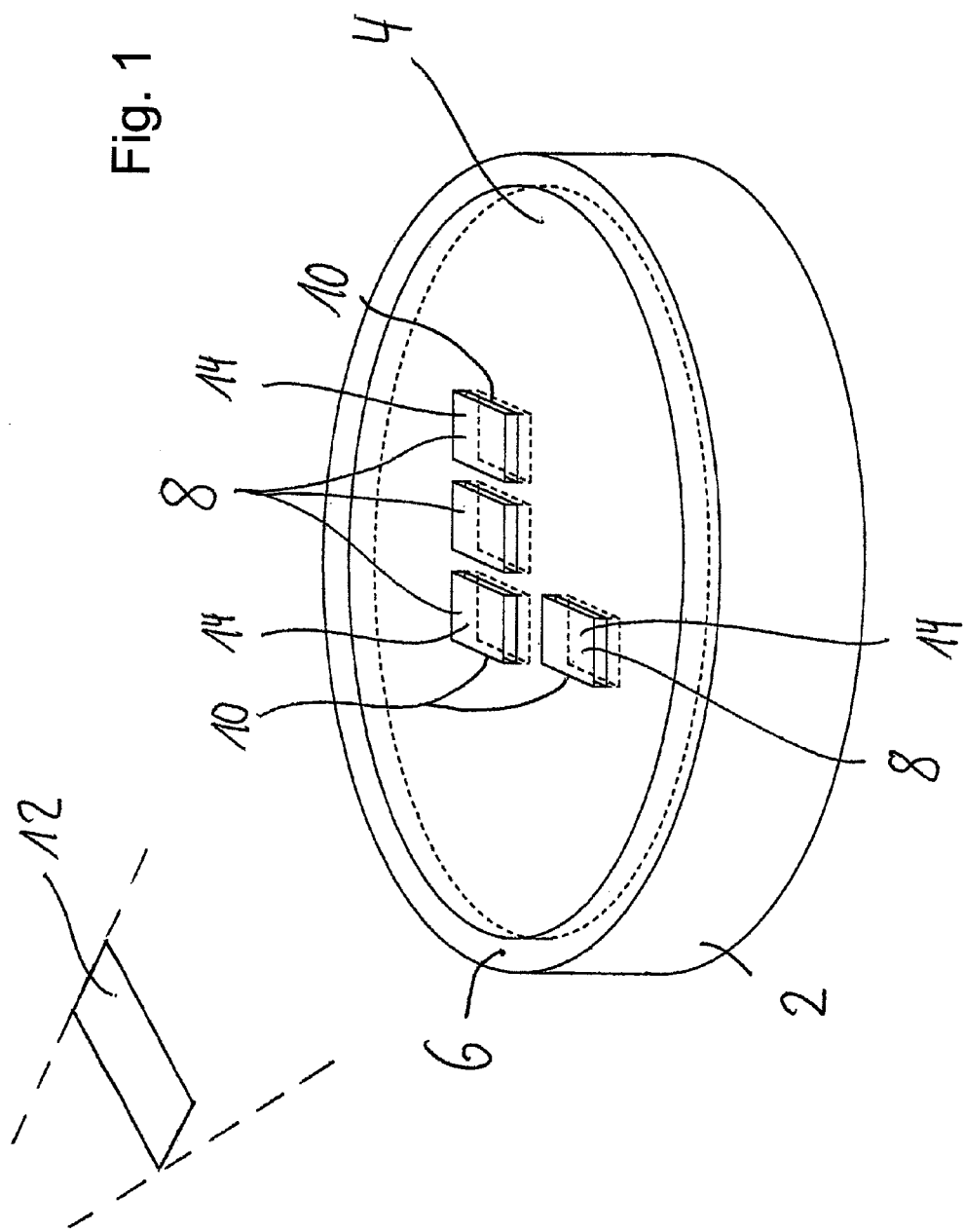
FIG. 1 shows a carrier with a plurality of semiconductor components.

FIG. 1 shows a silicon wafer generally illustrated as carrier 2. A multiplicity of semiconductor components 8 (only three illustrated), having boundaries 10, are formed on top of carrier 2, but the exact spatial position of semiconductor components 8 on carrier 2 has no significance whatsoever for the first method step described below. Consequently, the position and location of boundaries 10 of semiconductor components 8 do not have to be known for the performance of the first method step, even though this generally applies in the prior art.

A basic structure 4 is then introduced into carrier 2 in the first method step, without taking account of the subsequent position or in particular boundaries 10 of semiconductor components 8. Basic structure 4 is therefore introduced into a surface 6 of carrier 2 continuously, i.e., in an uninterrupted fashion without any gaps, without taking the subsequent location of boundaries 10 into account.

In a second step, semiconductor components 8 or boundaries 10 thereof are then planned, identified or defined on surface 6 of carrier 2. A mask 12, for example a shadow cast mask, is accordingly produced, so that a covering layer 14, metal in the example here, is applied to basic structure 4 in the region of each semiconductor component 8. In contrast to the application of basic structure 4, covering layer 14 is applied selectively only in the region of the semiconductor components 8. In the region of boundaries 10, carrier 2 remains free of covering layer 14.

In a final step, carrier 2 or, more precisely, semiconductor components 8, are then singulated by means of carrier 2, in the region of boundaries 10, being severed over its entire thickness, together with basic structure 4 also present there.

Figure 2:
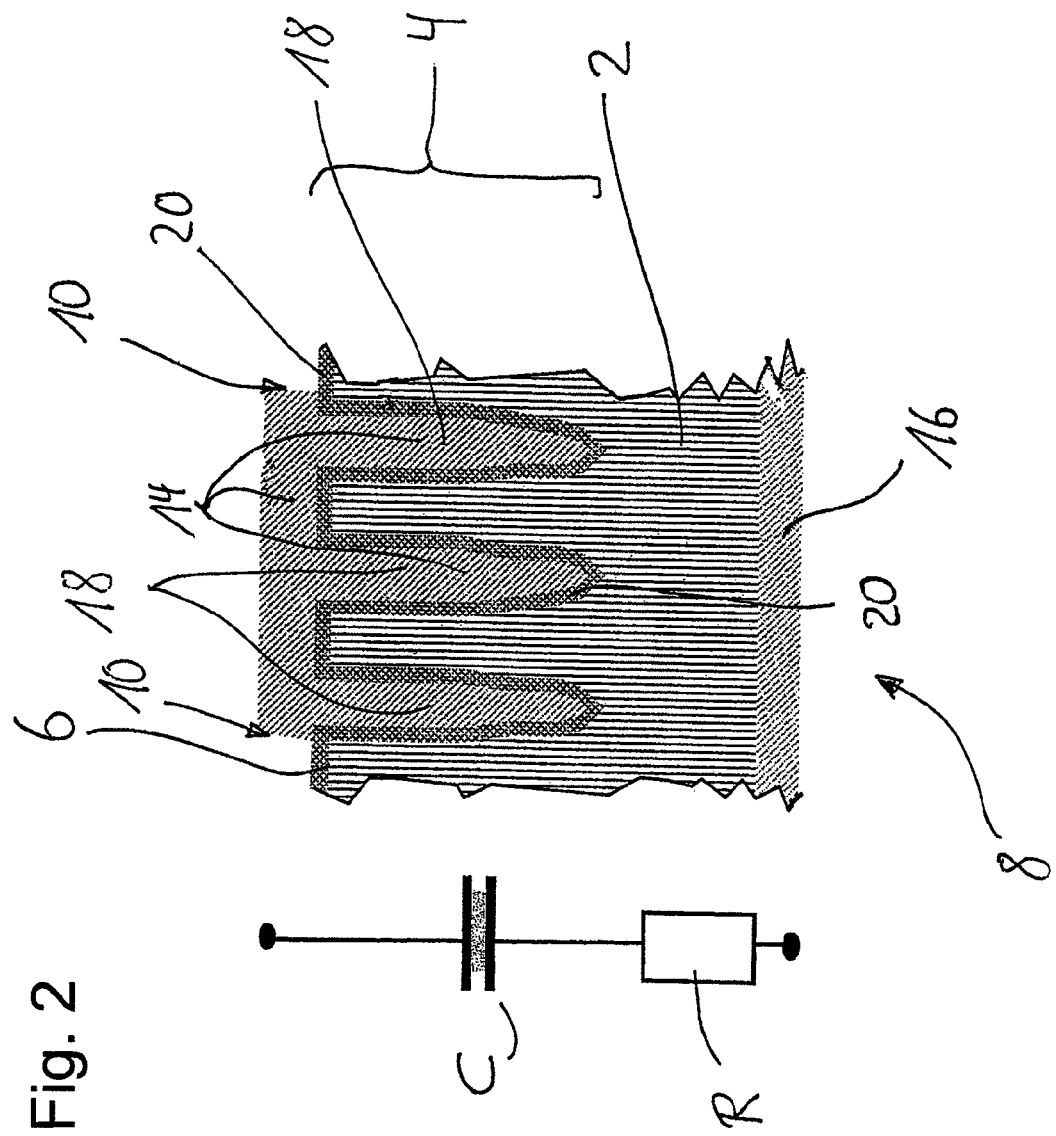
FIG. 2 shows a cross section through the carrier and a semiconductor component.

FIG. 2 shows a cross section through carrier 2 and a single semiconductor component 8. In FIG. 2, carrier 2 can once again be seen in the form of a silicon substrate with a metallization layer 16 as a bottom electrode. In FIG. 2, basic structure 4 consists of structure elements 18 that are etched perpendicularly into carrier 2 from surface 6 and are in the form of anisotropic holes or trench or hole structures and a dielectric layer 20, which covers both surface 6 and hole 18, i.e., the entire carrier 2. Structure elements 18 are arranged alongside one another in a manner distributed over the entire carrier 2. It can also be discerned in FIG. 2 that basic structure 4 extends without interruption over the entire carrier 2, and does not take into account boundaries 10 of semiconductor component 8. Covering layer 14 can also be seen as metallization in the form of a top electrode, which, however, was deposited in a manner delimited between boundaries 10 of semiconductor component 8. Therefore, no covering layer 14 is disposited on the carrier 2 outside of boundaries 10.

The semiconductor component 8 of FIG. 2 is a so-called 3D snubber having, between metallization 16 and covering layer 14, the equivalent circuit diagram of a resistor R and a capacitor C. In this case, both the resistance value R and the capacitance value C are determined by the base area occupied by semiconductor component 8 on carrier 4. In other words, the two parameters R and C of the snubber component would change if, instead of the three by three (square, only three visible in the sectional view) structure elements 18 illustrated in FIG. 2, in each case the adjacent structure elements 18 (four by four) were also covered by the covering layer 14 and a component composed of sixteen structure elements 18 was thus formed.

Figure 3:
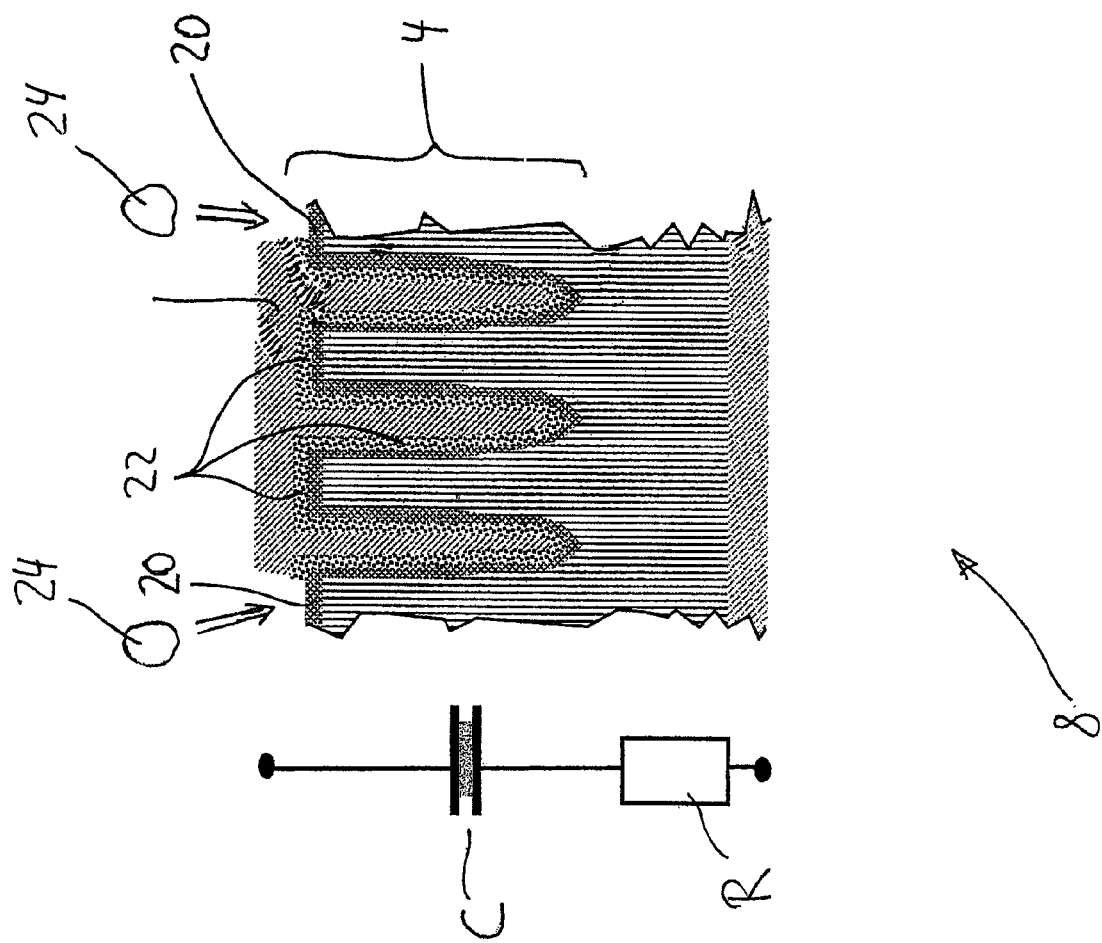
FIG. 3 shows a cross section in accordance with FIG. 2 for an alternative embodiment of a component.

FIG. 3 shows an alternative embodiment of a semiconductor component 8, wherein basic structure 4 additionally includes a further layer 22 applied to the dielectric layer 20. Further layer 22 is deposited in the form of a doped polysilicon layer as an additional top electrode in an area-covering fashion on carrier 2. However, since layer 22 shortens the insulating clearance after the subsequent cutting of the carrier 2 in the region of the boundaries 10 and would thus produce flashovers in semiconductor component 8, after the application of metallization 16 layer 22 as part of the basic structure is removed in the region of boundaries 10 by the application of TMAH 24 until layer 20 is uncovered.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve substantially the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for producing a plurality of integrated semiconductor components defined by boundaries and produced on a carrier, comprising:
    applying an active basic structure onto the carrier in a continuous fashion at least across a portion of the boundaries of the semiconductor components to be created;
    defining regions of the basic structure of the semiconductor components on the carrier;
    applying a patterned covering layer to the carrier only in the region of each semiconductor component; and
    securing the carrier between the boundaries to form the semiconductor components.

2. The method of claim 1, wherein said basic structure includes a plurality of identical structure elements arranged alongside one another.

3. The method of claim 2, wherein said structure elements includes a hole or trench structure.

4. The method of claim 1, wherein at least one portion of the basic structure is removed from the area on the carrier lying between the boundaries of adjacent semiconductor before the carrier is severed.

5. The method of claim 4,
    wherein said basic structure has a topmost auxiliary layer; and
    wherein, as part of said basic structure, said auxiliary layer is removed in the region of the boundaries.

6. The method of claim 5, wherein said auxiliary layer is formed of polysilicon.

7. The method of claim 5, wherein said auxiliary layer is removed by the application of TMAH.

8. The method of claim 1, wherein said covering layer is produced with the aid of a mask.

9. The method of claim 8, wherein said mask is a shadow casting mask.

10. The method of claim 1, wherein said covering layer is a metallization layer.

11. The method of claim 1, wherein the carrier is a silicon wafer.

12. The method of claim 1, wherein the semiconductor components are semiconductor-based snubber components.

13. The method of claim 12, wherein the semiconductor-based snubber components are 3D snubbers.

* * * * *